(12) United States Patent
Huang et al.

(10) Patent No.: US 11,706,928 B2
(45) Date of Patent: Jul. 18, 2023

(54) MEMORY DEVICE AND METHOD FOR FABRICATING THE SAME

(71) Applicant: Taiwan Semiconductor Manufacturing Co., Ltd., Hsinchu (TW)

(72) Inventors: Rainer Yen-Chieh Huang, Hsinchu (TW); Hai-Ching Chen, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/166,078

(22) Filed: Feb. 3, 2021

(65) Prior Publication Data

US 2022/0139935 A1   May 5, 2022

Related U.S. Application Data

(60) Provisional application No. 63/107,579, filed on Oct. 30, 2020.

(51) Int. Cl.
*H01L 51/30* (2006.01)
*H01L 29/78* (2006.01)
*H10B 51/30* (2023.01)
*H01L 29/66* (2006.01)

(52) U.S. Cl.
CPC ......... *H10B 51/30* (2023.02); *H01L 29/6684* (2013.01); *H01L 29/78391* (2014.09)

(58) Field of Classification Search
CPC ............ H01L 27/1159; H01L 29/6684; H01L 29/78391; H01L 27/11507; H01L 27/11514; H01L 27/11597

USPC ........................................................ 257/295
See application file for complete search history.

(56) References Cited

U.S. PATENT DOCUMENTS

| | | | |
|---|---|---|---|
| 6,921,702 B2 | 7/2005 | Ahn et al. |
| 7,217,643 B2 | 5/2007 | Liang et al. |
| 7,833,913 B2 | 11/2010 | Clark |
| 8,568,530 B2 | 10/2013 | Heys et al. |

(Continued)

FOREIGN PATENT DOCUMENTS

KR    20200026668 A    3/2020

OTHER PUBLICATIONS

Ribes et al. "Review on High-k Dielectrics Reliability Issues" IEEE Transactions on Device and Materials Reliability, vol. 5, No. 1, Mar. 2005. Published Mar. 2005.

(Continued)

*Primary Examiner* — Sheikh Maruf
(74) *Attorney, Agent, or Firm* — Eschweiler & Potashnik, LLC

(57) ABSTRACT

An integrated circuit device includes a ferroelectric layer that is formed with chlorine-free precursors. This ferroelectric material may be of the composition $HF_xZr_{1-x}O_2$. The ferroelectric layer may be used in a memory device such as a ferroelectric field effect transistor (FeFET). A ferroelectric layer formed with chlorine-free precursors has no chlorine residue. The absence of chlorine ameliorates time-dependent dielectric breakdown (TDDB) and Bias Temperature Instability (BTI).

20 Claims, 6 Drawing Sheets

(56) References Cited

U.S. PATENT DOCUMENTS

| | | | | |
|---|---|---|---|---|
| 2002/0177244 | A1* | 11/2002 | Hsu | H01L 29/78391 257/E21.208 |
| 2003/0027360 | A1* | 2/2003 | Hsu | H01L 29/78391 257/E21.208 |
| 2004/0182315 | A1* | 9/2004 | Laflamme, Jr. | H01L 21/6719 118/715 |
| 2005/0260347 | A1* | 11/2005 | Narwankar | H01L 21/3141 257/E21.267 |
| 2005/0269613 | A1* | 12/2005 | Li | H01L 29/78391 257/295 |
| 2008/0023746 | A1* | 1/2008 | Choi | H01L 21/31604 438/785 |
| 2009/0020797 | A1 | 1/2009 | Wang | |
| 2009/0057737 | A1* | 3/2009 | Boescke | H01L 28/91 257/295 |
| 2009/0261395 | A1* | 10/2009 | Boescke | H01L 21/02194 257/295 |
| 2010/0243994 | A1* | 9/2010 | Yoon | H01L 29/40111 257/295 |
| 2010/0261342 | A1* | 10/2010 | Clark | H01L 29/513 438/591 |
| 2012/0007158 | A1* | 1/2012 | Yoon | H01L 29/40111 257/295 |
| 2014/0355328 | A1* | 12/2014 | Muller | G11C 11/2275 257/295 |
| 2015/0340372 | A1* | 11/2015 | Pandey | H01L 29/6684 257/295 |
| 2016/0118280 | A1* | 4/2016 | Wood | H01L 21/67769 414/804 |
| 2018/0151577 | A1* | 5/2018 | Mueller | H01L 29/66545 |
| 2018/0166453 | A1* | 6/2018 | Müller | H01L 28/60 |
| 2018/0174826 | A1* | 6/2018 | Raaijmakers | H01L 21/0228 |
| 2018/0269057 | A1* | 9/2018 | Lei | C23C 16/45536 |
| 2018/0331113 | A1 | 11/2018 | Liao et al. | |
| 2018/0337053 | A1* | 11/2018 | Huang | H01L 29/66871 |
| 2019/0067488 | A1* | 2/2019 | Tsai | H01L 21/28194 |
| 2019/0130956 | A1* | 5/2019 | Müller | H01L 27/1159 |
| 2019/0189627 | A1* | 6/2019 | Pandey | H01L 29/516 |
| 2019/0244973 | A1* | 8/2019 | Yoo | G11C 11/223 |
| 2020/0020762 | A1* | 1/2020 | Frank | H01L 21/02356 |
| 2020/0035493 | A1* | 1/2020 | Clark | C23C 16/56 |
| 2020/0075075 | A1 | 3/2020 | Chen et al. | |
| 2020/0303558 | A1* | 9/2020 | Fujii | G11C 5/063 |
| 2021/0013219 | A1 | 1/2021 | Okuno et al. | |

OTHER PUBLICATIONS

Gall et al. "Advanced concepts for TDDB reliability in conjunction with 3D stress" AIP Conference Proceedings 1601, 79 (2014), published on Feb. 17, 2015.

Wikipedia.org "Time-dependent gate oxide breakdown" Published on Jun. 21, 2020.

Yoon et al. "Influence of Applied Current Density on Properties of Cu thin layer Electrodeposited from Copper Pyrophosphate Bath" J Korean Inst. Surf. Eng., vol. 53, No. 4, 2020, published on Aug. 30, 2020.

* cited by examiner

MEMORY DEVICE AND METHOD FOR FABRICATING THE SAME

REFERENCE TO RELATED APPLICATION

This application claims the benefit of U.S. Provisional Application No. 63/107,579, filed on Oct. 30, 2020, the contents of which are incorporated herein by reference in their entirety.

BACKGROUND

Many modern-day electronic devices contain electronic memory. Electronic memory may be volatile memory or non-volatile memory. Non-volatile memory is able to retain its stored data in the absence of power, whereas volatile memory loses its stored data when power is lost. Dynamic random-access memory (DRAM) that requires frequent refresh is volatile memory. Non-volatile electronic memory includes, for example, resistive random-access memory (RRAM), magnetoresistive random-access memory (MRAM), ferroelectric random-access memory (FeRAM), phase-change memory (PCM), and so on.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
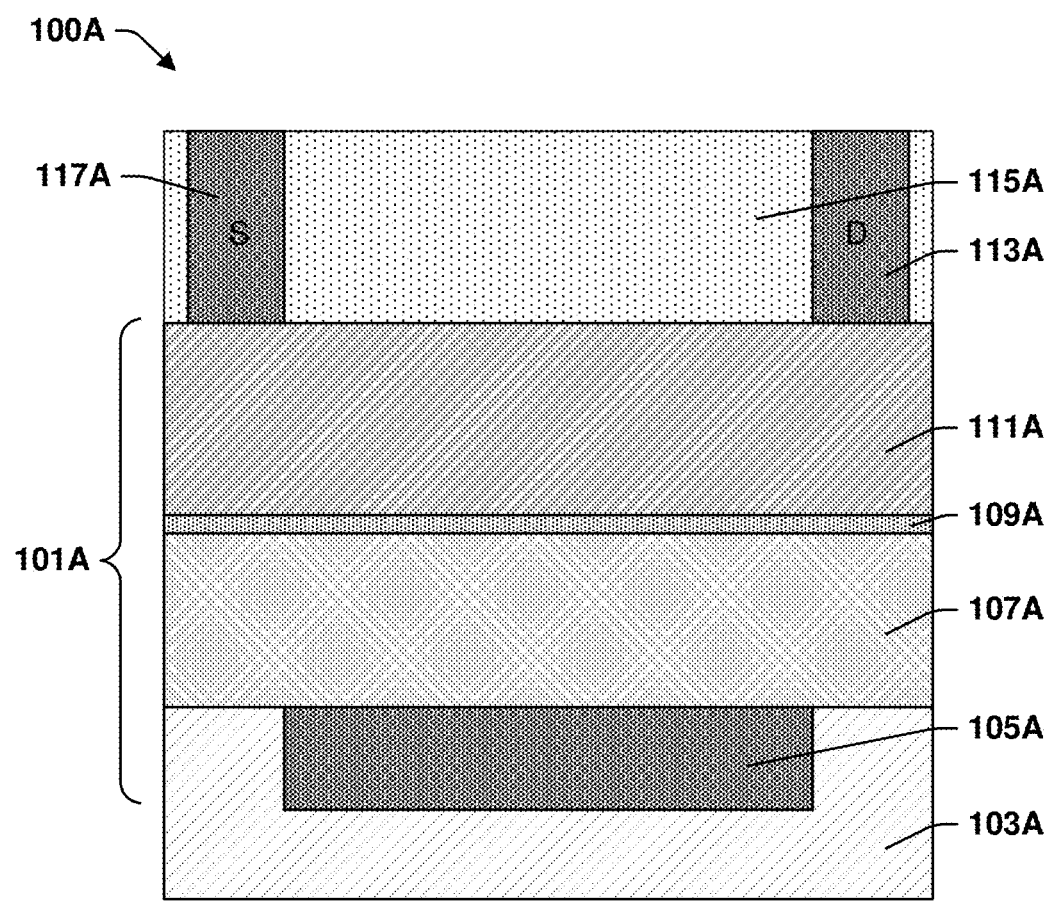
FIG. 1A illustrates a cross-sectional side view of an integrated circuit device according to some aspects of the present teachings.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A variety of integrated circuit devices include layers of ferroelectric material. For example, certain memory devices use a ferroelectric layer as a data storage layer. In some of these memory devices, the ferroelectric layer stores the data by retaining a polarization of electric dipoles. A first orientation of those electrical dipoles may represent a logical "1" and a second orientation may represent a logical "0". There are a variety of memory structures in which the ferroelectric material may be employed. In some embodiments of a ferroelectric memory, the ferroelectric layer is disposed between two plates in a capacitor that stores data. A 1T-1C memory architecture, for example, may use ferroelectric capacitors. In other embodiments of a ferroelectric memory, the ferroelectric layer is disposed between a gate electrode and a channel in a transistor structure that stores data. A ferroelectric field effect transistor (FeFET) is an example. Regardless of the structure in which the ferroelectric layer appears, it is desirable that the device has a long lifetime and high reliability. One mechanism that may limit lifetime is time-dependent dielectric breakdown (TDDB) in the ferroelectric layer. Although the mechanisms of TDDB are not certain, it may be observed that a leakage current through a ferroelectric layer increases over extended periods of operation. One mechanism that may limit reliability is bias temperature instability (BTI) such as positive bias temperature instability (PBTI) and negative bias temperature instability (NBTI). BTI may relate to charge trapping in a ferroelectric layer and manifests as a variation in a threshold voltage of a device that includes the ferroelectric layer over a period of continuous operation.

The inventors of the present disclosure have determined that TDDB and BTI can be ameliorated by eliminating chlorine residues from ferroelectric layers. They have determined that as little as 1 ppm chlorine can result in TDDB/BTI and that TDDB/BTI can be substantially mitigated by producing ferroelectric materials with less than 1 ppm chlorine. This phenomenon has been observed in particular with ferroelectric materials of the composition $HF_xZr_{1-x}O_2$. The result is expected to extend to other ferroelectric materials. In the formula, x has a range from 0 to 1. Examples in accordance with the formula include $HfO_2$, $HfZrO_2$, and $ZrO_2$.

Ferroelectric layers are conventionally produced by atomic layer deposition (ALD) using metal chloride precursors. The performance of a ferroelectric layer is strongly influenced by layer thickness. ALD allows precise control of thickness. Metal chloride precursors have volatilities and reaction rates well suited to the ALD process. In accordance with some embodiments of the present disclosure, however, the ferroelectric layer is produced from precursors that include chlorine-free metal compounds. Using precursors that are chlorine-free metal compounds can eliminate chlorine residues.

In some embodiments, the precursors include metal compounds in which the metal is directly bonded to oxygen, nitrogen, carbon, or a combination thereof. In some embodiments, the precursors include a metal compound in which the metal is directly bonded to carbon. In some embodiments, the precursors include a metal compound in which the metal is directly bonded to oxygen. In some embodiments, the precursors include a metal compound in which the metal is directly bonded exclusively to oxygen and/or carbon. In some embodiments, the precursors include a metal compound in which the metal is directly bonded to nitrogen. In some embodiments, the precursors include a metal compound in which the metal is directly bonded exclusively to nitrogen. Excellent results have been obtained with precursors of the form $M(NR^1R^2)_4$, where M is zirconium (Zr), hafnium (Hf), or the like and $R^1$ and $R^2$ are organic functional groups. In some embodiments, the organic functional groups are alkanes, alkenes, alkynes, alcohols, amines, ethers, aldehydes, ketones, carboxylic acids, esters, amides, or the like. In some embodiments, the precursors include one or more of:

zirconium(IV) tert-butoxide ($Zr[OC(CH_3)_3]_4$ or ZTB);
bis(methyl-μ5-clyclopentadienyl)methoxymethylzirconium ($Zr[CH_3C_5H4]_2CH_3OCH_3$, ZRCMMM, or ZrD-CO4);
tetrakis(dimethylamino)zirconium(IV) ($Zr[N(CH_3)_2]_4$ or TDMAZ);
tetrakis(ethylmethylamido)zirconium(IV) ($Zr[N(CH_3)(C_2H_5)]_4$ or TEMAZ);
bis(methyl-η5-clyclopentadienyl)dimethylhafnium (Hf$[CH_3C_5H_4]_2CH_3OCH_3$, HFCMME, or HfD-CO2);
bis(methyl-η5-clyclopentadienyl)methoxymethylhafnium ($HfCH_3OCH_3[C_5H_4]_2$ or HfD-CP4);
tetrakis(dimethylamino)hafnium(IV) ($Hf[N(CH_3)_2]_4$ or TDMAH);
tetrakis(ethylmethylamido)hafnium(IV) ($Hf[N(CH_3)(C_2H_5)]_4$ or TEMAH);
or the like.

The ferroelectric layer may be incorporated into any type of integrated circuit device. In some embodiments, the ferroelectric layer is included in a memory cell of a memory device. The memory can be of any type. In some embodiments the ferroelectric memory includes the ferroelectric layer in a transistor structure. In some embodiments, the transistor has a bottom gate. In some embodiments, the transistor has a top gate. In some embodiments, the transistor is in a three-dimensional (3D) memory array. In some embodiments, the transistor has a metal-ferroelectric-semiconductor (MFS) structure. In some embodiments, the transistor has a metal-ferroelectric-insulator-semiconductor (MFIS) structure. In some embodiments the ferroelectric memory includes the ferroelectric layer in a capacitor structure. In some embodiments, the memory is ferroelectric random access memory (FeRAM) in which the ferroelectric capacitor is coupled to a drain region of a field effect transistor (FET). In some embodiments, the memory has a metal-ferroelectric-metal-insulator-semiconductor (MFMIS) structure in which the ferroelectric capacitor is coupled to the gate of an FET.

A ferroelectric memory cell according to the present teachings has a lower time-dependent dielectric breakdown rate (TDDB rate) and a lower BTI rate in comparison to an equivalent ferroelectric memory cell with just 1 PPM more of chlorine in the ferroelectric layer. TDDB rates may not be well characterized over short periods of operation but may be consistently determined when consider over a longer period of operation such as a period over which the leakage current doubles or a period over which the Weibull slope is decreasing. Accordingly, for use in comparisons, the TDDB rate may be defined as the initial leakage current divided by a time of operation over which the initial leakage current doubles. Alternatively, the TDDB rate may be determined over a period in which the Weibull slope is decreasing.

The ferroelectric layer of a ferroelectric memory cell according to the present disclosure may be formed with chlorine-free precursors. The ferroelectric layer of a comparison ferroelectric memory cell may be formed by adding some chloride precursors to the process gas mix. The comparison ferroelectric memory cell will have a larger TDDB rate than that of the ferroelectric memory cell according to the present teachings. In some embodiments, the TDDB rate is half or less that of a comparison memory cell that has 1 PPM more of chlorine in the ferroelectric layer. In some embodiments, BTI rate, defined as the rate at which the threshold voltage changes during continuous operation, is half or less that of the comparison memory cell.

In some embodiments, a device according to the present teachings has a ferroelectric layer that is an HfZrO layer of the formula $HF_xZr_{1-x}O_2$, where x in the range from 0 to 1. In some embodiments, the ferroelectric layer is $HF_xZr_{1-x}O_2$, where x in the range from 0.1 to 0.9. In some embodiments, the ferroelectric layer 107A is $HF_{0.5}Zr_{0.5}O_2$. In some embodiments, the ferroelectric layer has HFZrO in more than 50% combined t-phase (tetragonal), o-phase (orthorhombic), and c-phase (cubic) and less than 50% m-phase (monoclinic). In some embodiments, the HFZrO is doped with smaller radius ions that increase 2Pr. Smaller radius ions include ions of aluminum (Al), silicon (Si), and the like. In some embodiments, the HFZrO is doped with larger radius ions that increase 2Pr. Larger radius ions include ions of lanthanum (La), scandium (Sc), calcium (Ca), barium (Ba), gadolinium (Gd), yttrium (Y), and the like. 2Pr is a measure of the switching polarization of a ferroelectric material. In some embodiments, the ferroelectric layer has less than 1 PPM chlorine. In some embodiments, the ferroelectric layer is chlorine free. In some embodiments, the ferroelectric layer has oxygen vacancies.

FIG. 1A illustrates an integrated circuit device 100A having a memory cell 101A according to some aspects of the present teachings. The memory cell 101A includes a ferroelectric layer 107A in a transistor structure. The transistor structure includes the ferroelectric layer 107A, a channel layer 111A, a gate electrode 105A, a source coupling 117A, and a drain coupling 113A. The ferroelectric layer 107A is between the channel layer 111A and the gate electrode 105A. Optionally, the ferroelectric layer 107A and the channel layer 111A are separated by a dielectric layer 109A. The gate electrode 105A is underneath the ferroelectric layer 107A. Accordingly, the gate electrode 105A is a bottom gate. The gate electrode 105A may be buried in a substrate 103A. The source coupling 117A and the drain coupling 113A may be vias in an interlevel dielectric 115A and may connect with a metal interconnect structure formed over the substrate 103A.

The ferroelectric layer 107A has little or no chlorine residue. In some embodiments, the ferroelectric layer 107A is HfZrO having 1 PPM or less chlorine. In some embodiments, the ferroelectric layer 107A is chlorine free. In some embodiments, the ferroelectric layer 107A is aluminum nitride (AlN) doped with scandium (Sc) or the like. The ferroelectric layer 107A may alternatively be another ferroelectric material with little or no chlorine, e.g., 1 PPM or less. Examples of other ferroelectric materials that may be used include, without limitation, hafnium aluminum oxide (HfAlO), hafnium lanthanum oxide (HfLaO), hafnium zirconium oxide (HfZrO), hafnium cerium oxide (HfCeO), hafnium oxide (HfO), hafnium silicon oxide (HfSiO), hafnium gadolinium oxide (HFGdO), or the like.

In some embodiments, the ferroelectric layer 107A is from 0.1 nm to 100 nm thick. In some embodiments, the ferroelectric layer 107A, is from 1 nm to 30 nm thick. If the ferroelectric layer 107A is too thin, it may not provide adequate threshold voltage switching in the memory cell 101A. If the ferroelectric layer 107A is too thick, it may not have a desired concentration of oxygen vacancies.

The dielectric layer 109A, if present, may be an insulating layer or a blocking layer. In some embodiments, the dielectric layer 109A has a thickness in the range from 0.1 nm to 10 nm. In some embodiments, the dielectric layer 109A has a thickness in the range from 0.3 nm to 3 nm. If the dielectric layer 109A is too thin, it may not be functional. If the dielectric layer 109A is too thick, it may interfere with operation of the memory cell 101A. The dielectric layer 109A may comprise silicon (Si), magnesium (Mg), aluminum (Al), yttrium (Y), lanthanum (La), strontium (Sr), gadolinium (Gd), scandium (Sc), calcium (Ca), a compound thereof, a combination thereof, or the like. In some embodiments, the dielectric layer 109A includes hafnium oxide ($HfO_2$). In some embodiments, the dielectric layer 109A includes hafnium oxide ($HfO_2$) and silicon (Si) in which the atomic ration of silicon is 10% or more.

The channel layer 111A may be or include a semiconductor. In some embodiments, the channel layer 111A is or includes an oxide semiconductor. Oxide semiconductors that may be suitable for the channel layer 111A include, without limitation, zinc oxide (ZnO), magnesium oxide (MgO), gadolinium oxide (GdO), indium tungsten oxide (InWO), indium gallium zinc oxide (InGaZnO), indium zinc oxide (InZnO), indium gallium zinc tin oxide (InGaZnSnO or IGZTO), indium tin oxide (InSnO or ITO), combinations thereof, or the like. In some embodiments, the channel layer 111A is or includes polysilicon, amorphous silicon, silicon geranium (SiGe), or the like. In some embodiments, the channel layer 111A has a thickness in the range from 0.1 nm to 100 nm. In some embodiments, the channel layer 111A has a thickness in the range from 2 nm to 30 nm. In some embodiments, the channel layer 111A has a thickness in the range from 5 nm to 20 nm.

The source coupling 117A, the drain coupling 113A, and the gate electrode 105A, may be formed of any suitable conductive materials. Suitable conductive materials may include doped polysilicon, graphene, metals, and the like. In some embodiments, the source coupling 117A, the drain coupling 113A, and the gate electrode 105A are formed with metals. Some examples of metals that may be used are tungsten (W), copper (Cu), ruthenium (Ru), molybdenum (Mo), cobalt (Co), aluminum (Al), nickel (Ni), silver (Ag), gold (Au), and the like, and alloys thereof. One or more of the source coupling 117A, the drain coupling 113A, and the gate electrode 105A may further include a diffusion barrier layer, a glue layer, or other such layer. Some examples of materials that may be used for a diffusion barrier layer or a glue layer are titanium nitride (TiN), tantalum nitride (TaN), molybdenum nitride (MoN), zirconium nitride (ZrN), hafnium nitride (HfN), and the like.

The interlevel dielectric 115A may be undoped silicate glass (USG) or the like. In some embodiments, the interlevel dielectric 115A is a low-K dielectric. In some embodiments, the interlevel dielectric 115A is an extremely low-K dielectric. A low-K dielectric is a material having a dielectric constant lower than that of silicon dioxide. Examples of low-K dielectrics include organosilicate glasses (OSG) such as carbon-doped silicon dioxide, fluorine-doped silicon dioxide (otherwise referred to as fluorinated silica glass or FSG), and organic polymer low-k dielectrics. Examples of organic polymer low-k dielectrics include polyarylene ether, polyimide (PI), benzocyclobutene, and amorphous polytetrafluoroethylene (PTFE). An extremely low-κ dielectric is a material having a dielectric constant of about 2.1 or less. An extremely low-κ dielectric can be formed by deposition of a low-κ dielectric in such a manner that it has porosity or air-gaps, whereby the effective dielectric constant of the composite including pores and air gaps is 2.1 or less.

The substrate 103A may be a die cut from a wafer, such as a silicon wafer or the like. The substrate 103A may be a semiconductor substrate, such as a bulk semiconductor, a semiconductor-on-insulator (SOI) substrate, or the like. Other substrates, such as a multilayered or gradient substrate may also be used. In some embodiments, the semiconductor material of the substrate 103A is or includes silicon, germanium, silicon carbide, gallium arsenide, gallium phosphide, indium phosphide, indium arsenide, and/or indium antimonide, silicon germanium, gallium arsenide phosphide, aluminum indium arsenide, aluminum gallium arsenide, gallium indium arsenide, gallium indium phosphide, gallium indium arsenide phosphide, combinations thereof, or the like. The substrate 103A may be or include a dielectric material. For example, the substrate 103A may be a dielectric substrate or may include a dielectric layer on a semiconductor substrate. The dielectric material may be an oxide such as silicon oxide, a nitride such as silicon nitride, a carbide such as silicon carbide, combinations thereof such as silicon oxynitride, silicon oxycarbide, silicon carbonitride, the like, or any other suitable dielectric.

In the memory cell 101A, there is threshold voltage on the gate electrode 105A at which the channel layer 111A begins to conduct between the source coupling 117A and the drain coupling 113A. That threshold voltage may be varied through write and erase operations that alter a polarization of electrical dipoles within the ferroelectric layer 107A. A first orientation of those electrical dipoles provides a first threshold voltage that may represent a logical "1" and a second orientation of those electrical dipoles provides a second threshold voltage that may represent a logical "0".

A write operation for the memory cell 101A may include setting the gate electrode 105A to a programming voltage $V_{th}$ while grounding the source coupling 117A and the drain coupling 113A. $V_{th}$ may be the highest possible threshold voltage for the memory cell 101A. For an erase operation, the gate electrode 105A may be set to $-V_{th}$ while grounding the source coupling 117A and the drain coupling 113A. A read operation may include setting the gate electrode 105A to a voltage intermediate between the first threshold voltage and the second threshold voltage, for example ½ Vth, setting the source coupling 117A to $V_{dd}$, setting the drain coupling 113A, and determining whether a resulting current is above or below a threshold. Operation of the memory cell 101A includes a combination of the read, write, and erase operations. A specific operating protocol may be set for determining the TDDB rate or the BTI rate. In some embodiments, the operating protocol includes applying constant voltage stress (CVS). For the BTI rate, small gate voltage pulses may be applied to measure $V_{th}$ while voltage stress is continuously maintained.

Figure 1B:
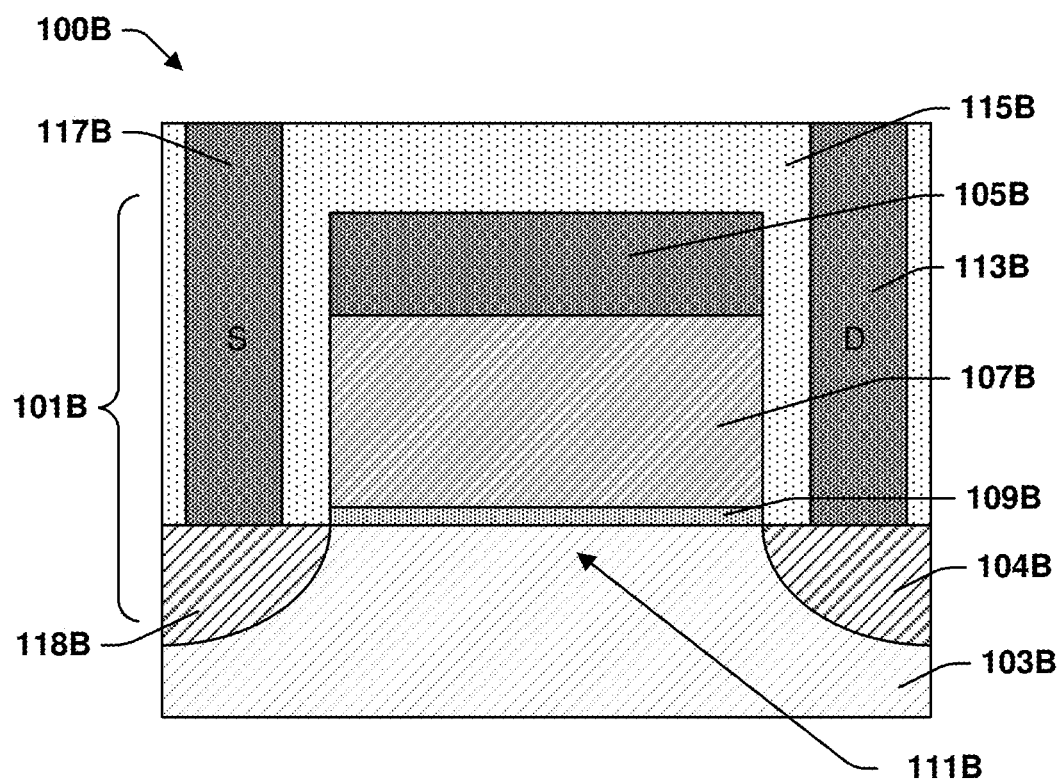
FIG. 1B illustrates a cross-sectional side view of an integrated circuit device according to some other aspects of the present teachings.

FIG. 1B illustrates an integrated circuit device 100B having a memory cell 101B according to some other aspects of the present teachings. The memory cell 101B has a transistor structure including a source region 118B, a drain region 104B, a channel layer 111B, a ferroelectric layer 107B, and a gate electrode 105B. The source region 118B, the drain region 104B, and the channel layer 111B are all provided by semiconductor portions of a substrate 103B. The source region 118B and the drain region 104B have one doping type and the channel layer 111B has an opposite doping type. A source coupling 117B connects with the source region 118B. A drain coupling 113B connects with the drain region 104B. The source coupling 117B and the drain coupling 113B are vias in an interlevel dielectric 115B and may connect with a metal interconnect structure formed over the substrate 103B. The gate electrode 105B is above the ferroelectric layer 107B and the channel layer 111B, which makes the gate electrode 105B a top gate. The ferroelectric layer 107B is between the channel layer 111B and the gate electrode 105B. Optionally, the ferroelectric layer 107B and the channel layer 111B are separated by a dielectric layer 109B. The layer thicknesses and compositions in the memory cell 101B may be as described for corresponding structures in the memory cell 101A.

While the memory cell 101B has been presented as a memory cell, the same arrangement of materials may be used in a conventional field effect transistor with metal oxide semiconductor structure (MOSFET). The ferroelectric layer 107B with the same composition may be used as a high-κ dielectric layer, although a different thickness may be more suitable for that application. As in the memory cell application, a low chlorine facilitates achieving low TDDB.

Figure 2:
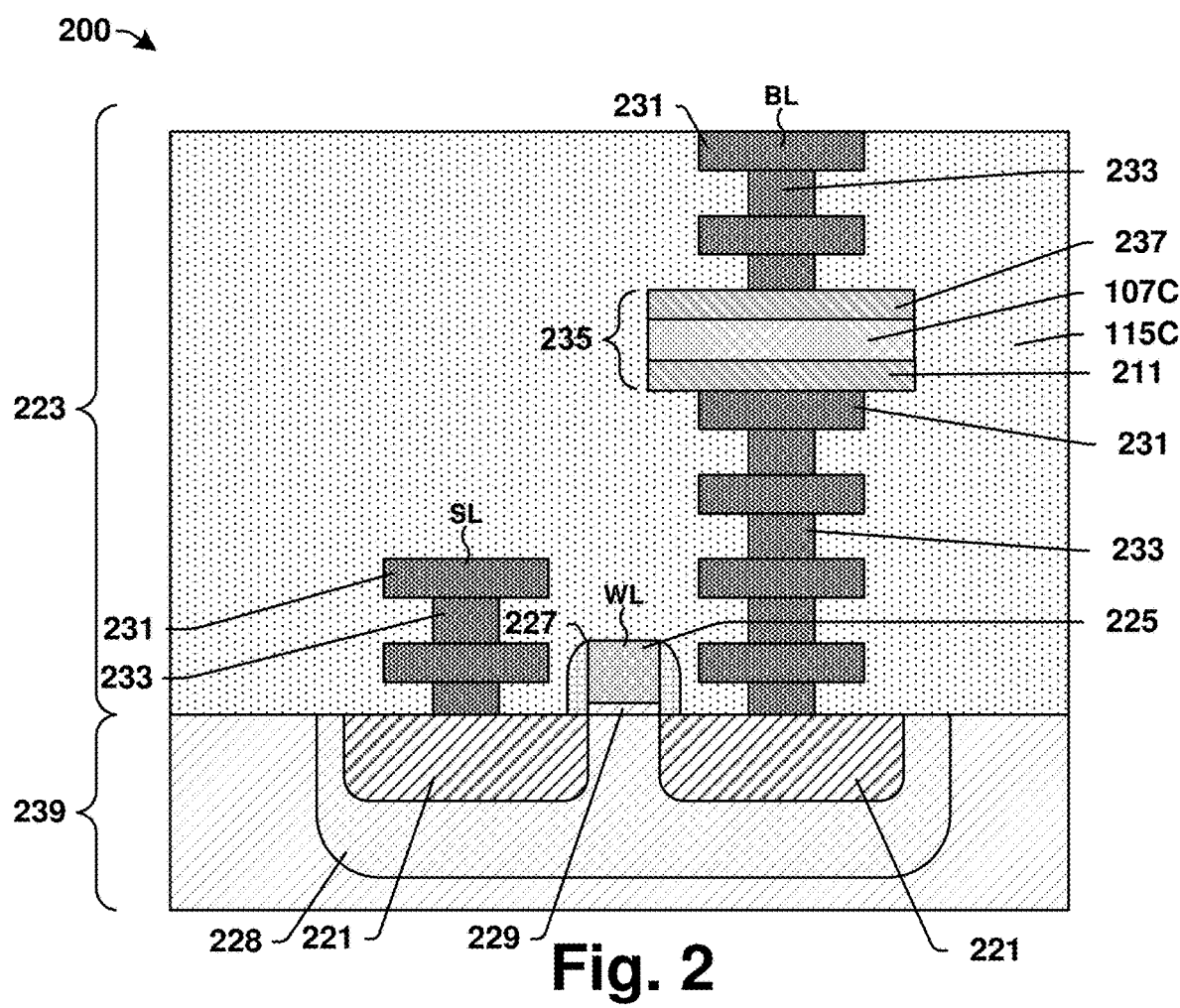
FIG. 2 illustrates a cross-sectional side view of an integrated circuit device according to some other aspects of the present teachings.

FIG. 2 illustrates an integrated circuit device 200 having a 1T1C memory device that includes a transistor 227 and a ferroelectric capacitor 235 according to some aspects of the present teachings. The ferroelectric capacitor 235 includes a ferroelectric layer 107C between a top electrode 237 and a bottom electrode 211. The ferroelectric capacitor 235 may disposed in a metal interconnect structure 223 that is formed over a semiconductor substrate 239. The metal interconnect structure 223 includes lines 231 and vias 233, which may be surrounded by an interlevel dielectric 115C. The ferroelectric capacitor 235 may be disposed between the $3^{rd}$ and $4^{th}$ metal interconnect layers, the $4^{th}$ and $5^{th}$ metal interconnect layers, or any other adjacent pair of metal interconnect layers in the metal interconnect structure 223. The transistor 227 may include a gate electrode 225 and a gate dielectric 229 formed over a doped region 228 of the semiconductor substrate 239. Source/drain regions 221 may be formed by other areas of the semiconductor substrate 239 having an opposite doping type.

The ferroelectric layer 107C is a material having a composition as described form the ferroelectric layer 107A. Likewise, the interlevel dielectric 115C has the compositional alternatives of the interlevel dielectric 115A. The ferroelectric capacitor 235 may be operated as a memory cell by applying suitable voltages to a word line (WL), a bit line (BL), and a source line (SL). If the ferroelectric layer 107C has a suitable thickness and mode of operation, it will store data according to the polarization of electrical dipoles. In that case, the ferroelectric capacitor 235 is ferroelectric memory cell. If the ferroelectric layer 107C has a suitable thickness and mode of operation, it will store data according to a charge on the capacitor. In that case, the ferroelectric capacitor 235 is dynamic random access memory (DRAM) cell.

FIGS. 3 through 6 are cross-sectional view illustrations exemplifying a method according to the present teachings of forming a memory cell having a ferroelectric layer according to the present teachings. While FIGS. 3 through 6 are described with reference to various embodiments of a method, it will be appreciated that the structures shown in FIGS. 3 through 6 are not limited to the method but rather may stand alone separate from the method. While FIGS. 3 through 6 are described as a series of acts, it will be appreciated that the order of the acts may be altered in other embodiments. While FIGS. 3 through 6 illustrate and describe a specific set of acts, some acts that are illustrated and/or described may be omitted in other embodiments. Further, acts that are not illustrated and/or described may be included in other embodiments. While the method of FIGS. 3 through 6 is described in terms of forming the integrated circuit device 100A, the method may be used to form other integrated circuit devices.

Figure 3:
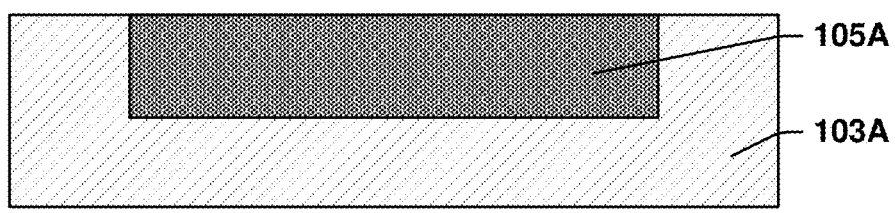
FIGS. 3-6 are a series of cross-sectional view illustrations exemplifying a method of forming a device such as the device of FIG. 1A.

As shown by the cross-sectional view 300 of FIG. 3, the method may begin by forming the gate electrode 105A in the substrate 103A. The gate electrode 105A may be formed, for example, by forming a photoresist mask over the substrate 103A, etching to form a trench in the substrate 103A, stripping the photoresist mask, filling the trench with a metal or other conductive material for the gate electrode 105A, and chemical mechanical polishing (CMP) to remove any of the metal or other conductive material that is outside the trench. Filling the trench with metal may include atomic layer deposition (ALD), chemical vapor deposition (CVD), physical vapor deposition (PVD), electroplating, electroless plating, the like, or any other suitable process.

Figure 4:
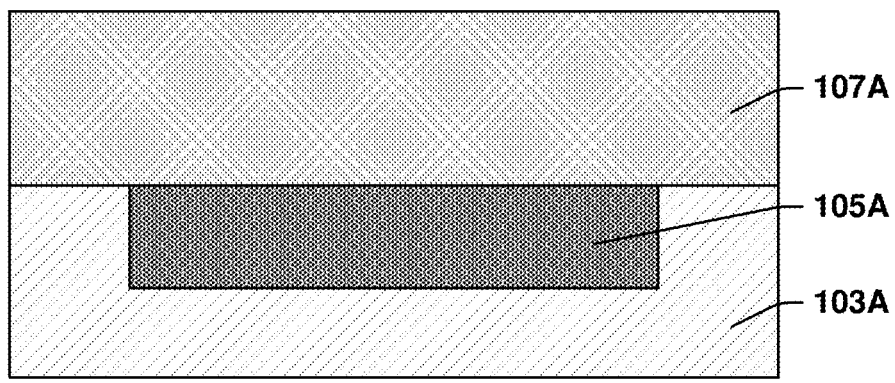

As shown by the cross-sectional view 400 of FIG. 4, the method may continue with forming the ferroelectric layer 107A. The ferroelectric layer 107A is formed by chemical vapor deposition (CVD), atomic layer deposition (ALD), or the like using chlorine-free gaseous precursors. In some embodiments, the ferroelectric layer 107A is formed by ALD as described more fully below.

Figure 5:
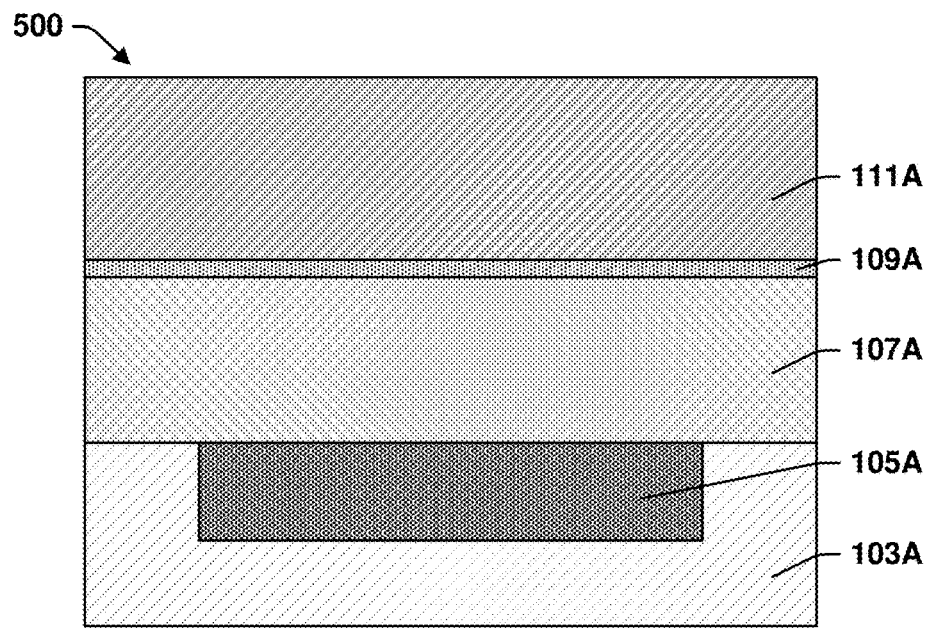

As shown by the cross-sectional view 500 of FIG. 5, the method may continue with forming the channel layer 111A, and optionally the dielectric layer 109A. The dielectric layer 109A and the channel layer 111A may be formed by chemical vapor deposition (CVD), physical vapor deposition (PVD), atomic layer deposition (ALD), any combination thereof, or the like, or any other suitable process or processes.

Figure 6:
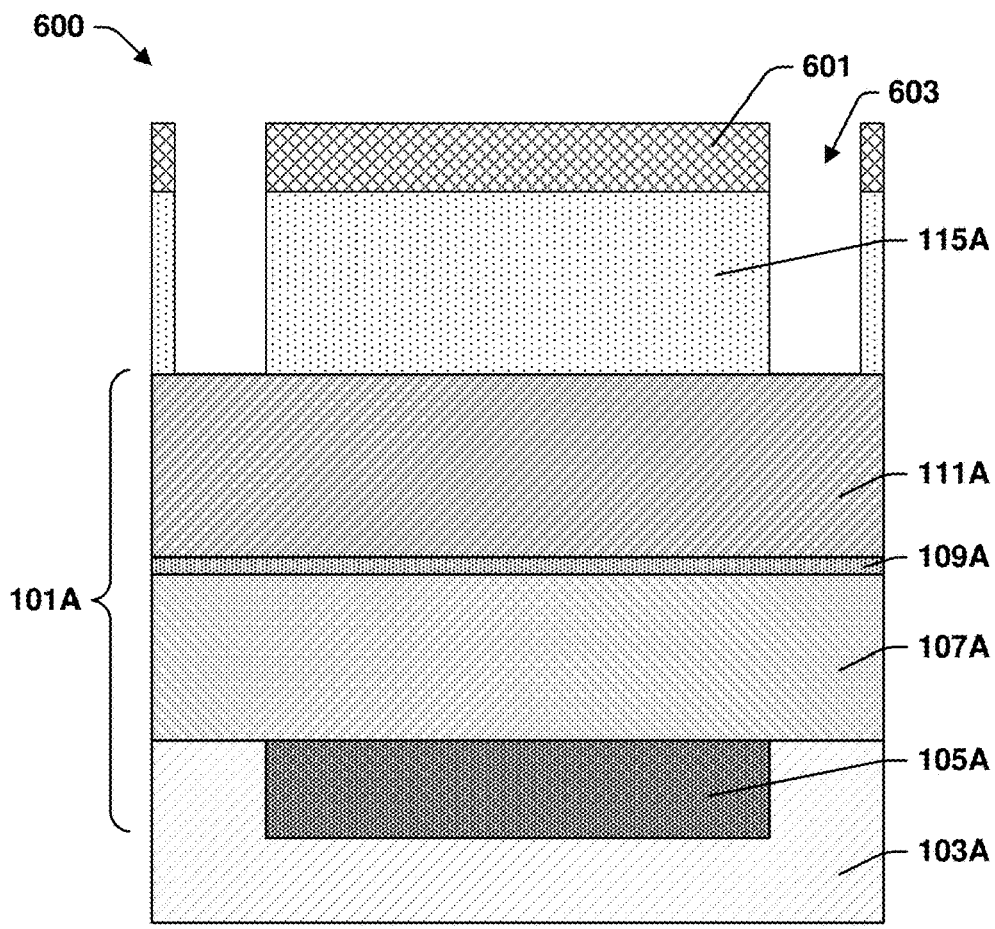

As shown by the cross-sectional view 600 of FIG. 6, the method may continue with forming the interlevel dielectric 115A over the channel layer 111A. The interlevel dielectric 115A may be formed by CVD, a liquid process such as a spin-on-glass process, or the like. In some embodiments, the interlevel dielectric 115A is undoped silicate glass (USG) formed by CVD with silane (SiH4) or tetraethyl orthosilicate (TEOS).

As further shown in FIG. 6, a photoresist mask 601 may be formed and used to etch trenches 603 in the interlevel dielectric 115A. Etching the trenches 603 may include a dry etch process such as plasma etching or any other suitable process. The trenches 603 may be filled with conductive material by atomic layer deposition (ALD), chemical vapor deposition (CVD), physical vapor deposition (PVD), electroplating, electroless plating, the like, or any other suitable process followed by planarization to form a structure as shown in FIG. 1A. Planarization may be CMP or any other suitable process.

Figure 7:
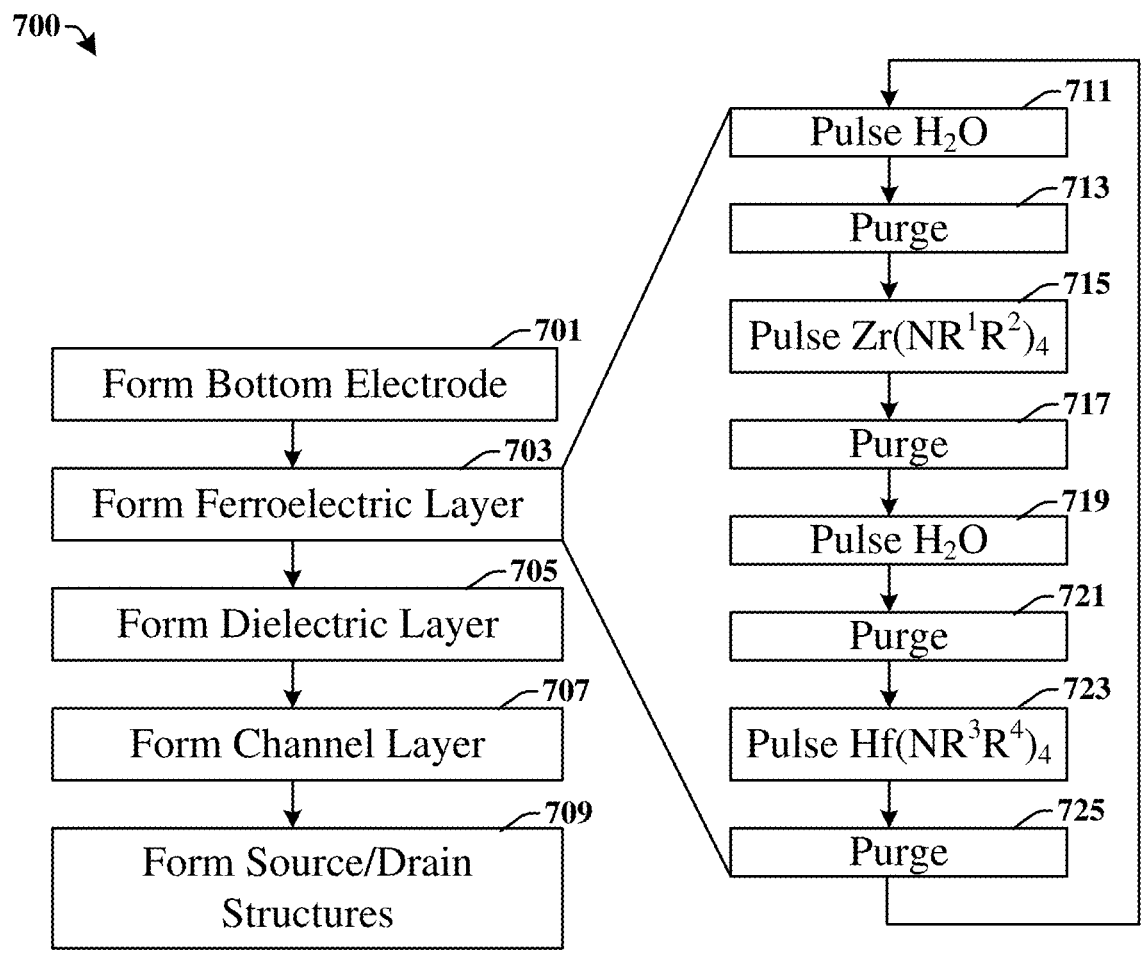
FIG. 7 provides a flow chart illustrating a method of forming an integrated circuit device including a ferroelectric layer according to the present teachings.

FIG. 7 presents a flow chart for a process 700 which may be used to form an integrated circuit device according to the present disclosure. The process 700 includes steps for forming the integrated circuit device 100A of FIG. 1A and also includes a method of forming the ferroelectric layer 107A that may be used to form other ferroelectric layers according to other embodiments of the present disclosure. While the process 700 of FIG. 7 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts are required to implement one or more aspects or embodiments of the description herein, and one or more of the acts depicted herein may be carried out in one or more separate acts and/or phases.

The process 700 may begin with act 701, forming a bottom electrode. The cross-sectional view of FIG. 3 provides an illustrative example.

The process continues with act 703, forming the ferroelectric layer. The cross-sectional view of FIG. 4 provides an illustrative example, although it should be appreciated that a ferroelectric layer according to the present teachings may be formed in a different structure or at a different stage of processing. Act 703 may include an atomic layer deposition (ALD) process as further illustrated by act 711 through act 725.

After forming the ferroelectric layer, the process 700 may continue with act 705 forming a dielectric layer and act 707, forming a channel layer. The cross-sectional view of FIG. 5 provides an illustrative example. Act 707, forming the dielectric layer, is optional.

The process may continue with act 709, forming source and drain structures. FIG. 5 together with FIG. 1A provide an example.

Act 703, forming the ferroelectric layer, may be ALD. ALD involves cyclically repeating a series of steps whereby the ferroelectric layer is deposited uniformly and at a controlled rate. As illustrated, the ALD process may begin with act 711, pulsing with water vapor or the like.

Pulsing means introducing the reagent into a process gas flow for a limited period of time. The process gas may include an inert carrier, such as nitrogen or argon that flows continuously through a chamber that contains the substrate. The chamber may be continuously exhausted through a vacuum system. In some embodiments, the ALD process is carried out at sub-atmospheric pressure. In some embodiments, the process is carried out at a pressure at or below 50 torr. In some embodiments, the process is carried out at pressures in the range from about 1 torr to about 10 torr. In some embodiments, the process is carried out at pressures in the range from about 2 torr to about 5 torr.

Through absorption or adsorption, a layer of the water vapor forms on a surface of the substrate. The water provides an oxygen source in chemical reactions that form the ferroelectric layer. Another suitable oxygen source may be substituted for water, such as $O_2$, $O_3$ or plasma $O_2$ or plasma $O_3$. The pulse is continued until the surface layer has formed. In some embodiments, the water pulse is 60 seconds or less. In some embodiments, the water pulse is in the range from one second to 10 seconds.

After the water has formed a layer on the surface, the process may continue with act 713, purging the chamber. Purging the chamber may be purging with a non-reactive gas. Nitrogen may be a non-reactive gas. In some embodiments, the purge lasts 30 seconds or less. In some embodiments, the purge lasts from one second to 10 seconds. In some embodiments, the purge lasts 5 seconds or less.

The process may continue with act 715, pulsing with a chlorine-free zirconium precursor. The chlorine-free zirconium precursor is a zirconium compound that reacts with the oxygen source on the surface to form a layer that includes zirconium. The precursor is selected to be volatile under the process conditions, to deposit only to an extent limited by the amount of the oxygen source such as water that is present on the surface, and to have an acceptable reaction rate. In some embodiments, the zirconium precursor pulse lasts 60 seconds or less. In some embodiments, the zirconium precursor pulse lasts from 0.5 seconds to 10 seconds. In some embodiments, the zirconium precursor pulse lasts from about 1 second to about 5 seconds.

In some embodiments, the zirconium precursor is a zirconium compound in which the zirconium is directly bonded to carbon. Bis(methyl-η5-clyclopentadienyl)methoxymethylzirconium ($Zr[CH_3C_5H_4]_2CH_3OCH_3$ or ZRCMMM) is an example. In some embodiments, the zirconium precursor is a zirconium compound in which the zirconium is directly bonded to oxygen. Zirconium(IV) tert-butoxide ($Zr[OC(CH_3)_3]_4$ or ZTB) is an example. In some embodiments, the zirconium precursor is a zirconium compound in which the zirconium is directly bonded to nitrogen. In some embodiments, the zirconium precursor has the form $Zr(NR^1R^2)4$ where and $R^1$ and $R^2$ are organic functional groups. tetrakis(dimethylamino)zirconium(IV) ($Zr[N(CH_3)_2]_4$ or TDMAZ) and tetrakis(ethylmethylamido)zirconium(IV) ($Zr[N(CH_3)(C_2H_5)]_4$ or TEMAZ) are examples. In some embodiments, the zirconium precursor is one of those shown in the following table, or the like:

| | |
|---|---|
| Bis(methyl-η5-clyclopentadienyl)methoxymethylzirconium | $Zr[CH_3C_5H_4]_2CH_3OCH_3$ |
| Zirconium(IV) tert-butoxide | $Zr[OC(CH_3)_3]_4$ |
| Tetrakis(dimethylamino)zirconium(IV) | $(Zr[N(CH_3)_2]_4$ |
| Tetrakis(ethylmethylamido)zirconium(IV) | $Zr[N(CH_3)(C_2H_5)]_4$ |
| Bis(cyclopentadienyl)zirconium(IV) | $C_{10}H_{12}Zr$ |
| Bis(methyl-η5-cyclopentadienyl)methoxymethylzirconium | $Zr(CH_3C_5H_4)_2CH_3OCH_3$ |
| Dimethylbis(pentamethylcyclopentadienyl)zirconium(IV) | $C_{22}H_{36}Zr$ |
| Tetrakis(dimethylamido)zirconium(IV) | $[(CH_3)_2N]_4Zr$ |
| Tetrakis(ethylmethylamido)zirconium(IV) | $Zr(NCH_3C_2H_5)_4$ |
| Zirconium(IV) dibutoxide(bis-2,4-pentanedionate) | $C_{18}H_{32}O_6Zr$ |
| Zirconium(IV) 2-ethylhexanoate | $Zr(C_8H_{15}O_2)_4$ |
| Zirconium tetrakis(2,2,6,6-tetramethyl-3,5-heptanedionate) | $Zr(OCC(CH_3)_3CHCOC(CH_3)_3)_4$ |

Following act 715 is act 717, another purge. This purge may be like the purge of act 713. There may then follow act 719, another water pulse like act 711, and act 721, another purge. Acts 719 and 721 may be similar or identical to acts 711 and 713 and admit of the same description.

The process may continue with act 723, pulsing with a chlorine-free hafnium precursor. The chlorine-free hafnium precursor is a hafnium compound that reacts with the oxygen source on the surface to form a layer that includes hafnium. The precursor is selected to be volatile under the process conditions, to deposit only to an extent limited by the amount of water or the like present on the surface, and to have an acceptable reaction rate. In some embodiments, the hafnium precursor pulse lasts 60 seconds or less. In some embodiments, the hafnium precursor pulse lasts from 0.5 seconds to 10 seconds. In some embodiments, the hafnium precursor pulse lasts from about 1 second to about 5 seconds.

In some embodiments, the hafnium precursor is a hafnium compound in which the hafnium is directly bonded to carbon. Bis(methyl-η5-clyclopentadienyl)dimethylhafnium ($Hf[CH_3C_5H_4]_2CH_3OCH_3$ or HfD-CO2) and bis(methyl-η5-clyclopentadienyl)methoxymethylhafnium ($HfCH_3OCH_3[C_5H_4]_2$ or HfD-CO4) are examples. In some embodiments, the hafnium precursor is a hafnium compound in which the hafnium is directly bonded to oxygen. In some embodiments, the hafnium precursor is a hafnium compound in which the hafnium is directly bonded to nitrogen. In some embodiments, the hafnium precursor has the form $Hf(NR^1R^2)4$, where $R^1$ and $R^2$ are organic functional groups. Tetrakis(dimethylamino)hafnium(IV) ($Hf[N(CH_3)_2]_4$ or TDMAH) and tetrakis(ethylmethylamido)hafnium(IV) ($Hf[N(CH_3)(C_2H_5)]_4$ or TEMAH) are examples. In some embodiments, the hafnium precursor is one or more of those described in the following table, or the like:

| | |
|---|---|
| Bis(methyl-η5-clyclopentadienyl)dimethylhafnium | Hf[CH₃C₅H₄]₂CH₃OCH₃ |
| Bis(methyl-η5-cyclopentadienyl)methoxymethylhafnium | HfCH₃OCH₃[C₅H₄]₂ |
| Tetrakis(dimethylamino)hafnium(IV) | (Hf[N(CH3)₂]₄ |
| tetrakis(ethylmethylamido)hafnium(IV) | Hf[N(CH₃)(C₂H₅)]₄ |
| Dimethylbis(cyclopentadienyl)hafnium(IV) | (C₅H₅)₂Hf(CH₃)₂ |
| Hafnium(IV) tert-butoxide | Hf[OC(CH₃)₃]₄ |
| Hafnium isopropoxide isopropanol | C₁₂H₂₈HfO₄ |
| Tetrakis(diethylamido)hafnium(IV) | [(CH₂CH₃)₂N]₄Hf |
| Tetrakis(dimethylamido)hafnium(IV) | [(CH₃)₂N]₄Hf |
| Tetrakis(ethylmethylamido)hafnium(IV) | [(CH₃)(C₂H₅)N]₄Hf |

Following act 723 is act 725, another purge and a repetition of the steps until the ferroelectric layer has been built up to a desired thickness. In the process as described, the actions that incorporate zirconium into the ferroelectric layer alternate with actions that incorporate hafnium into the ferroelectric layer. Optionally, the proportions of these actions are varied, or only the actions that incorporate zirconium are used or only the actions that incorporate halfnium are used. In some embodiments, one layer is deposited every 60 seconds or at a greater frequency. Selection of suitable precursors allows the desired rate to be achieved.

In some embodiments, an additional precursor that provides a metal ion is included with either the zirconium precursor or the hafnium precursor. Examples of metal ions that may be provided by the additional precursor include ions of aluminum (Al), silicon (Si), lanthanum (La), scandium (Sc), calcium (Ca), barium (Ba), gadolinium (Gd), yttrium (Y), and the like. In some embodiments the nrecursor is one of those shown in the following table, or the like:

or the like. In some embodiments, the metal ion is lanthanum (La) or the like. In some embodiments, the metal ion is gadolinium (Gd) or the like. In some embodiments, the metal ion is yttrium (Y) or the like. In some embodiments, the additional precursor includes the metal ion directly bonded to oxygen, nitrogen, carbon, or a combination thereof. In some embodiments, the additional precursor includes the metal ion directly bonded to carbon. In some embodiments, the additional precursor includes the metal ion directly bonded to oxygen. In some embodiments, the additional precursor includes the metal ion directly bonded exclusively to oxygen and/or carbon. In some embodiments, the additional precursor includes the metal ion directly bonded to nitrogen.

Some aspects of the present teachings relate to an integrated circuit device that includes a layer of material comprising $HF_xZr_{1-x}O_2$, wherein $0 \leq x \leq 1$ wherein the layer of material has less than 1 PPM chlorine. The layer is ferroelectric and may be used as a data storage layer in a memory device.

| | |
|---|---|
| Aluminum tris(2,2,6,6-tetramethyl-3,5-heptanedionate) | Al(OCC(CH₃)₃CHCOC(CH₃)₃)₃ |
| Triisobutylaluminum | Al[(CH₃)₂CHCH₂]₃ |
| Trimethylaluminum | Al(CH₃)₃ |
| Tris(dimethylamido)aluminum(III) | Al(N(CH₃)₂)₃ |
| (3-Aminopropyl)triethoxysilane | H₂N(CH₂)₃Si(OC₂H₅)₃ |
| N-sec-Butyl(trimethylsilyl)amine | C₇H₁₉NSi |
| 1,3-Diethyl-1,1,3,3-tetramethyldisilazane | C₈H₂₃NSi₂ |
| Dodecamethylcyclohexasilane | (Si(CH₃)₂)₆ |
| Hexamethyldisilane | (Si(CH₃)₃)₂ |
| Hexamethyldisilazane | (CH₃)₃SiNHSi(CH₃)₃ |
| 2,4,6,8,10-Pentamethylcyclopentasiloxane | (CH₃SiHO)₅ |
| Pentamethyldisilane | (CH3)₃SiSi(CH₃)₂H |
| Silicon tetrabromide | SiBr₄ |
| Tetraethylsilane | Si(C₂H₅)₄ |
| 2,4,6,8-Tetramethylcyclotetrasiloxane | (HSiCH₃O)₄ |
| 1,1,2,2-Tetramethyldisilane | (CH₃)₂SiHSiH(CH₃)₂ |
| Tetramethylsilane | Si(CH₃)₄ |
| N,N',N''-Tri-tert-butylsilanetriamine | HSi(HNC(CH₃)₃)₃ |
| Tris(tert-butoxy)silanol | ((CH₃)₃CO)₃SiOH |
| Tris(tert-pentoxy)silanol | (CH₃CH₂C(CH₃)₂O)₃SiOH |
| Tris[N,N-Bis(trimethylsilyl)amide]gadolinium(III) | Gd(N(Si(CH₃)₃)₂)₃ |
| Tris(tetramethylcyclopentadienyl)gadolinium(III) | C₂₇H₃₉Gd |
| Tris(isopropylcyclopentadienyl)gadolinium | C₂₄H₃₃Gd |
| Triethylgallium | (CH₃CH₂)₃Ga |
| Trimethylgallium | Ga(CH₃)₃ |
| Tris(dimethylamido)gallium(III) | C₁₂H₃₆Ga₂N₆ |
| Lanthanum(III) isopropoxide | C₉H₂₁LaO₃ |
| Tris[N,N-bis(trimethylsilyl)amide]lanthanum(III) | La(N(Si(CH₃)₃)₂)₃ |
| Tris(cyclopentadienyl)lanthanum(III) | La(C₅H₅)₃ |
| Lanthanum (2,2,6,6-tetramethyl-3,5-heptanedionato) | La(OCC(CH₃)₃CHCOC(CH₃)₃)₃ |
| Tris(tetramethylcyclopentadienyl)lanthanum(III) | C₂₇H₃₉La |
| Tris[N,N-bis(trimethylsilyl)amide]yttrium | [[(CH₃)₃Si]₂N]₃Y |
| Tris(butylcyclopentadienyl)yttrium(III) | Y(C₅H₄CH₂(CH₂)₂CH₃)₃ |
| Tris(cyclopentadienyl)yttrium(III) | Y(C₅H₅)₃ |
| Yttrium 2-methoxyethoxide | C₉H₂₁O₆Y |
| Yttrium(III) tris(isopropoxide) | C₉H₂₁O₃Y |
| Yttrium(III) tris(2,2,6,6-tetramethyl-3,5-heptanedionate) | Y(OCC(CH₃)₃CHCOC(CH₃)₃)₃ |

In some embodiments, the metal ion is aluminum (Al) or the like. In some embodiments, the metal ion is silicon (Si)

Some aspects of the present teachings relate to an integrated circuit device comprising having memory cell that includes a channel extending between a source and a drain, a gate electrode, and a ferroelectric layer between the gate electrode and the channel. The memory cell has a leakage current and a time-dependent dielectric breakdown rate (a TDDB rate). The TDDB rate is defined as an initial value of the leakage current divided by a time of operation over which the leakage current doubles from the initial value. The TDDB rate is less than an amount by which the TDDB rate would increase if 1 PPM of chlorine were added to the ferroelectric layer.

Some aspects of the present teachings relate to a method of forming an integrated circuit device that includes forming a ferroelectric layer by atomic layer deposition using chlorine-free precursors. The chlorine-free precursors may include a zirconium (Zr) precursor, a hafnium precursor, or both types of precursors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit device, the method comprising:
   forming a ferroelectric layer by an atomic layer deposition (ALD process) using chlorine-free precursors, wherein the ferroelectric layer has a top surface that results from the ALD process and the chlorine-free precursors comprise a hafnium (Hf) compound and a zirconium (Zr) compound;
   prior to any further processing of the ferroelectric layer subsequent to the ALD process, depositing either a dielectric layer-metal oxide semiconductor layer stack, a metal oxide semiconductor layer, or a top electrode layer directly over and in contact with the top surface.

2. The method of claim 1, wherein the chlorine-free precursors further comprise a compound of aluminum (Al), silicon (Si), lanthanum (La), scandium (Sc), calcium (Ca), barium (Ba), gadolinium (Gd), or yttrium (Y).

3. The method of claim 1, wherein the chlorine-free precursors are compounds in which nitrogen is bonded to a metal.

4. The method of claim 1, wherein the chlorine-free precursors are compounds in which carbon is bonded to a metal.

5. The method of claim 1, wherein the chlorine-free precursors are compounds of a form $M\text{-}(N\text{---}R)_n$, wherein M is a metal, R is one or more organic functional groups, and n is an integer.

6. A method of forming an integrated circuit device, the method comprising:
   forming a bottom electrode layer in or on a substrate;
   forming a ferroelectric layer having a top surface directly over the bottom electrode layer by an atomic layer deposition process that includes repeating steps comprising:
      exposing the substrate to an evaporated zirconium (Zr) compound that is chlorine-free and forms a first surface layer;
      exposing the substrate to a first gas so that the first gas reacts with the first surface layer to form a zirconium-containing layer;
      exposing the substrate to an evaporated hafnium (Hf) compound that is chlorine-free and forms a second surface layer;
      exposing the substrate to the first gas so that the first gas reacts with the second surface layer to form a hafnium-containing layer;
   forming either a dielectric layer-metal oxide semiconductor layer stack, a metal oxide semiconductor layer, or a top electrode layer directly over and in contact with the top surface that is uppermost in the ferroelectric layer at the conclusion of the atomic layer deposition process.

7. The method of claim 6, wherein the ferroelectric layer has less than 1 PPM chlorine.

8. The method of claim 6, wherein:
   a structure comprising the bottom electrode layer, the ferroelectric layer, and the top electrode layer has a leakage current and a time-dependent dielectric breakdown (TDDB) rate;
   the TDDB rate is less than an amount by which the TDDB rate would increase if 1 PPM of chlorine were added to the ferroelectric layer; and
   the TDDB rate is defined as an initial value of the leakage current divided by a time of operation over which the leakage current doubles from the initial value.

9. The method of claim 6, wherein the evaporated zirconium compound (Zr) and the evaporated hafnium compound (Hf) are of a form $M\text{-}(N\text{---}R^1R^2)_n$, wherein M is a metal, $R_1$ and $R_2$ are organic functional groups, and n is an integer.

10. The method of claim 6, wherein the evaporated zirconium compound (Zr) and the evaporated hafnium compound (Hf) are metals bonded to functional groups through oxygen, carbon, or oxygen and carbon.

11. A method of forming an integrated circuit device, the method comprising:
   forming a bottom electrode layer;
   forming by atomic layer deposition from chlorine-free gaseous metal precursors comprising a zirconium (Zr) precursor and a hafnium (Hf) precursor a ferroelectric layer with an upper surface directly over the bottom electrode layer; and
   immediately after the atomic layer deposition process, forming either a dielectric layer-metal oxide semiconductor layer stack, a metal oxide semiconductor layer, or a top electrode layer over and in direct contact with the upper surface, wherein the chlorine-free gaseous metal precursors are metals bonded with organic functional groups via oxygen, carbon, or nitrogen.

12. The method of claim 11, wherein the ferroelectric layer has less than 1 PPM chlorine.

13. The method of claim 1, wherein the method comprises depositing the dielectric layer-metal oxide semiconductor layer stack directly over and in contact with the top surface.

14. The method of claim 1, wherein the method comprises depositing the top electrode layer over and in direct contact with the top surface.

15. The method of claim 6, wherein forming the ferroelectric layer further comprises exposing the substrate to a chlorine-free precursors of aluminum (Al), silicon (Si), lanthanum (La), scandium (Sc), calcium (Ca), barium (Ba), gadolinium (Gd), or yttrium (Y).

16. The method of claim 6, wherein the method comprises forming the dielectric layer-metal oxide semiconductor layer stack directly over and in contact with the top surface.

17. The method of claim 6, wherein the method comprises forming the top electrode layer directly over and in contact with the top surface.

18. The method of claim 11, wherein the chlorine-free gaseous metal precursors further comprise a compound of aluminum (Al), silicon (Si), lanthanum (La), scandium (Sc), calcium (Ca), barium (Ba), gadolinium (Gd), or yttrium (Y).

19. The method of claim 11, wherein the method comprises forming the dielectric layer-metal oxide semiconductor layer stack over and in direct contact with the upper surface.

20. The method of claim 11, wherein the method comprises forming the top electrode layer over and in direct contact with the upper surface.

* * * * *